(12) United States Patent
Uematsu et al.

(10) Patent No.: US 9,933,475 B2
(45) Date of Patent: Apr. 3, 2018

(54) SEMICONDUCTOR DEVICE AND MULTI-CHIP MODULE

(71) Applicant: HITACHI, LTD., Chiyoda-ku, Tokyo (JP)

(72) Inventors: Yutaka Uematsu, Tokyo (JP); Hideki Osaka, Tokyo (JP); Tadanobu Toba, Tokyo (JP); Kenichi Shimbo, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 15/535,219

(22) PCT Filed: Apr. 24, 2015

(86) PCT No.: PCT/JP2015/062514
§ 371 (c)(1),
(2) Date: Jun. 12, 2017

(87) PCT Pub. No.: WO2016/170678
PCT Pub. Date: Oct. 27, 2016

(65) Prior Publication Data
US 2017/0350933 A1    Dec. 7, 2017

(51) Int. Cl.
*H01L 23/00* (2006.01)
*G01R 31/04* (2006.01)
*H01L 25/065* (2006.01)
*H01L 23/498* (2006.01)
*G01R 31/28* (2006.01)

(52) U.S. Cl.
CPC ....... *G01R 31/041* (2013.01); *G01R 31/2851* (2013.01); *H01L 23/49838* (2013.01); *H01L 24/16* (2013.01); *H01L 25/0655* (2013.01); *H01L 25/0657* (2013.01); *H01L 2224/1623* (2013.01); *H01L 2225/06513* (2013.01);
(Continued)

(58) Field of Classification Search
CPC ....... G01R 31/04; G01R 31/28; H01L 25/065; H01L 23/498; H01L 23/00
USPC ........................................................ 257/48
See application file for complete search history.

(56) References Cited

U.S. PATENT DOCUMENTS 7,279,921 B1 *  10/2007  Iacob ............... G01R 31/31713
                                                          324/537
8,614,584 B2 *  12/2013  Liu ....................... G11C 29/022
                                                          324/537
2009/0066362 A1 *  3/2009  Akahori ............. G01R 31/2853
                                                          326/16

FOREIGN PATENT DOCUMENTS

JP          2008-122338 A      5/2008

* cited by examiner

*Primary Examiner* — Asok K Sarkar
*Assistant Examiner* — Dmitriy Yemelyanov
(74) *Attorney, Agent, or Firm* — Miles & Stockbridge P.C.

(57) ABSTRACT

Provided is a semiconductor inspection circuit which is capable of inspecting connection states of power supply, ground, and signal bumps in a semiconductor package or a printed circuit board equipped with a semiconductor LSI mounted in a product operation state. As a means to solve the problem, a circuit capable of switching a path is provided at an input portion of a driver/receiver, a mechanism capable of transferring an output of a path switching circuit near a receiver circuit to a voltage waveform circuit with an internal variable terminal is provided, and a breakage state of a bump can be observed in the product operation state by observing a DC level at a terminal having a certain DC resistance when a signal bump connection state is observed and receiving a step wave and observing a response waveform thereof when an IO power supply bump connection state is observed.

19 Claims, 12 Drawing Sheets

(52) U.S. Cl.
CPC ............... *H01L 2225/06517* (2013.01); *H01L 2225/06541* (2013.01)

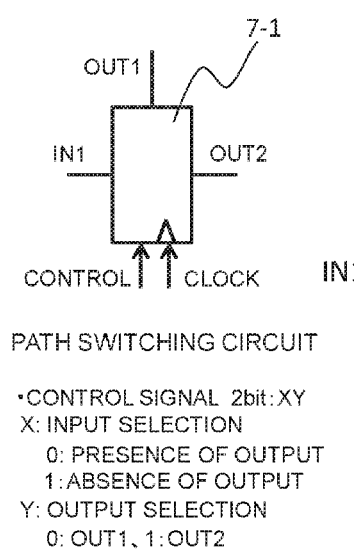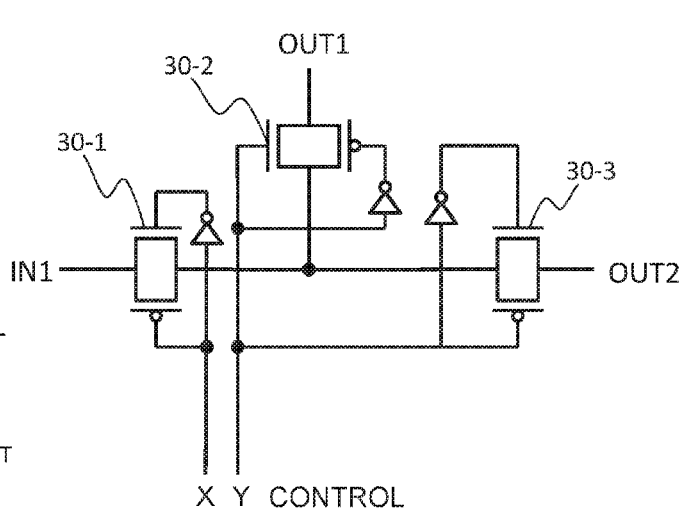
FIG. 4A
PATH SWITCHING CIRCUIT
・CONTROL SIGNAL 2bit:XY
X: INPUT SELECTION
   0: PRESENCE OF OUTPUT
   1: ABSENCE OF OUTPUT
Y: OUTPUT SELECTION
   0: OUT1、1: OUT2
FIG. 4B

SEMICONDUCTOR DEVICE AND MULTI-CHIP MODULE

TECHNICAL FIELD

The present disclosure relates to a technique for monitoring the connection state of a wiring path and identifying an abnormal portion in a semiconductor LSI, a semiconductor LSI package, and a printed circuit board which are used for an information device, an infrastructure control device, an automobile, or the like.

BACKGROUND ART

A multi-chip module in which a plurality of semiconductor integrated circuit chips are incorporated into one package is provided with wirings for connecting the chips in the package. If a wiring has a defect, even if each chip has no defect, a multi-chip module becomes a defective product.

Such a wiring defect can be detected by a function test which is performed on the entire package. However, it is not always easy to clarify a correlation between a function defect and a wiring defect.

As background technology of the present technical field, there is JP 2008-122338 A (Patent Document 1). JP 2008-122338 A discloses a technique of inspecting wirings between circuit blocks and an inspection facilitation circuit. In FIG. 2 which is a representative drawing, an inspection pin is provided so that a signal can be applied from the outside of an IC to a cathode of a diode connected to a $V_{DD}$ side in an input protection circuit of an inspection target IC #i+1, and it is changed to an inspection facilitation input protection circuit. At the time of inspection, the inspection pin of the inspection target IC #i+1 is connected to a GND via a resistor Rm, and a failure excitation input "H level" is outputted from a boundary scan flip-flop to an output pin d of a connection target IC # i. An electric current flows along a current path to the inspection pin from a power voltage supply pin of IC # i towards the resistor Rm in an inspection target wiring (a wiring between a pin e of the IC #i+1 and the pin d of the IC # i). This electric current is measured, and if there is an abnormality in the electric current, it is determined as a failure. There is an advantage in that it is possible to specify a position in which a failure occurs.

CITATION LIST

Patent Document

Patent Document 1: JP 2008-122338 A

SUMMARY OF THE INVENTION

Problems to be Solved by the Invention

In the inspection method disclosed in Patent Document 1, a static current is applied to a wiring portion connecting circuit blocks via an input/output circuit connecting both circuit blocks and a resistor attached to the outside of a circuit block connected therebefore, and at that time, a voltage generated between both ends of the resistor is measured, and a failure is determined based on a change in a voltage by a resistance change in the wiring portion.

As an example using this technology, a system in package (SiP) equipped with a high bandwidth memory (HBM) standardized in JEDEC which is a DRAM standardization organization is known. In the SiP, the HBM and an LSI which is a target communicating with the HBM are mounted on a fine wiring substrate represented by a Si interposer, and the HBM and the LSI are electrically connected through a wiring in the interposer. The LSI mounted on the interposer is connected by a solder having a diameter of about 20 μm which is called a microbump, and breakage or a defective connection thereof becomes an implementation problem.

The inspection technology disclosed in Patent Document 1 can be used to monitor a breakage state of the microbump. Specifically, since an electrical resistance of the microbump portion increases when the breakage of the microbump portion progresses, it is possible to visualize the breakage condition by decreasing a voltage generated in an external resistor portion when a static current flows.

In this method, the state is visualized by connecting the wiring portion (the microbump portion) of the inspection target with the external voltage observation resistor in series. Therefore, the method can be used for targets that are connected in a one-to-one manner such as signal wiring, but there is a problem in that it is difficult in principle to test a wiring portion in which one pin is connected to a plurality of target pins through a plurality of paths such as a power supply pin or a ground pin.

For example, in the case of the HBM, signal pins 51-1 to 51-4 for data signals, a power supply pin 52-1, and ground pins 53-1 and 53-2 have a bump arrangement illustrated in FIG. 3, and a ratio thereof is 4:1:2. Therefore, since the number of power supply pins and the number of ground pins are small than the number of signals, when one pin is broken, power impedance around a broken portion is increased, and power noise of the input/output circuit gets worse, and thus state detection of the power supply pin and the ground pin is also is an important factor for guaranteeing operation reliability. Further, in the bump connection portion, since a mounting state of the LSI or a current distribution when it is mounted on a product and operates is a factor for determining breakage of the connection portion, it is necessary to monitor the state in the device operation state.

The present invention provides an inspection circuit which is capable of detecting an electric or physical connection state of a signal pin, a power supply pin, or a ground pin in an device operation state while minimizing addition of a circuit to a semiconductor LSI in order to guarantee operation reliability of a semiconductor LSI constituting an SiP with a multi-chip module when the semiconductor LSI is mounted on a product, and the product operates.

Solutions to Problems

In order to solve the above problems, the present invention provides a semiconductor device which include a first circuit block including first and second output circuits, a second circuit block including first and second input circuits, and a wiring block that connects an output pin from the first output circuit and an input pin to the first input circuit via a wiring and connects an output pin from the second output circuit and an input pin to the second input circuit via a wiring, wherein power supply pins of the first and second circuit blocks configured to supply electric power to the output circuits and the input circuits and a ground pin are connected with a wiring for power supply to the wiring block and a wiring for a ground, and the second circuit block includes a path switching circuit provided at a stage prior to the input circuits, a resistance switcher provided ahead of a path bifurcated by the path switching circuit, and a voltage observation circuit for observing a voltage between both ends of a resistor of the resistance switcher.

In order to solve the above problems, in the present invention, in the semiconductor device, connection states of the power supply pins are inspected by applying a logic input fixed to high to the first output circuit, applying a logic input of a step wave that switches from low to high to the second output circuit, and observing a power variation waveform bifurcated by the path switching circuit at the stage prior to the first input circuit through the voltage observation circuit.

In order to solve the above problems, in the present invention, in the semiconductor device, a connection state of a wiring path that connects the output pin from the first output circuit with the input pin to the first input circuit is inspected by applying a logic input which performs transition of low→high→low and has a period of high fixed to a period of time enough to measure a DC resistance (an order of μs) to the first input circuit and by observing a power variation waveform bifurcated by the path switching circuit at the stage prior to the first input circuit through the voltage observation circuit.

Further, in order to solve the above problems, the present invention provides a first semiconductor LSI including first and second output circuits, a second semiconductor LSI including first and second input circuits, and a wiring substrate in which an output pin from the first output circuit is connected with an input pin to the first input circuit via a wiring, and an output pin from the second output circuit is connected with an input pin to the second input circuit via a wiring, wherein power supply pins of the first and second semiconductor LSIs configured to supply electric power to the output circuits and the input circuits and a ground pin are connected with a wiring for power supply to the wiring substrate and a wiring for a ground, and the second semiconductor LSI includes a path switching circuit provided at a stage prior to the input circuits, a resistance switcher provided ahead of a path bifurcated by the path switching circuit, and a voltage observation circuit for observing a voltage between both ends of a resistor of the resistance switcher.

Effects of the Invention

When the present invention is applied, a device that monitors the connection states of the power supply pine, the ground pin, and the signal pin is provided. Such a device can be applied to a wide range of semiconductor products such as information devices, infrastructure control devices, and in-vehicle devices.

BRIEF DESCRIPTION OF THE DRAWINGS

FIGS. 4A and 4B are circuit diagrams of an example of a path switching circuit according to the first embodiment.

MODE FOR CARRYING OUT THE INVENTION

Figure 1:
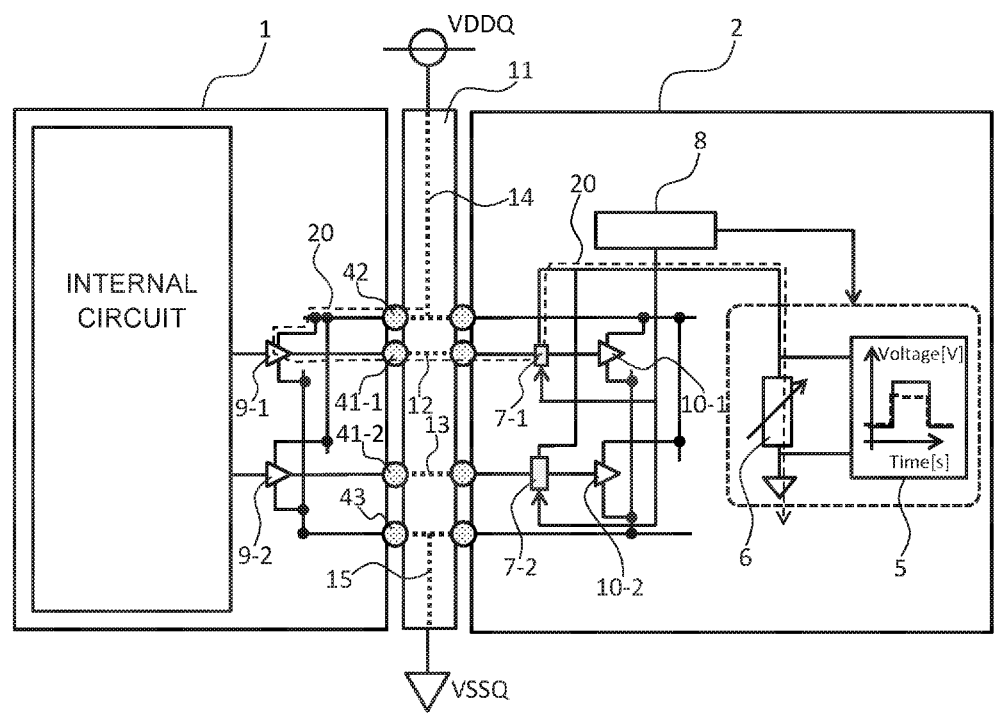
FIG. 1 is a representative diagram (a first embodiment) of the present invention and illustrates a basic circuit configuration according to the first embodiment.
Figure 2:
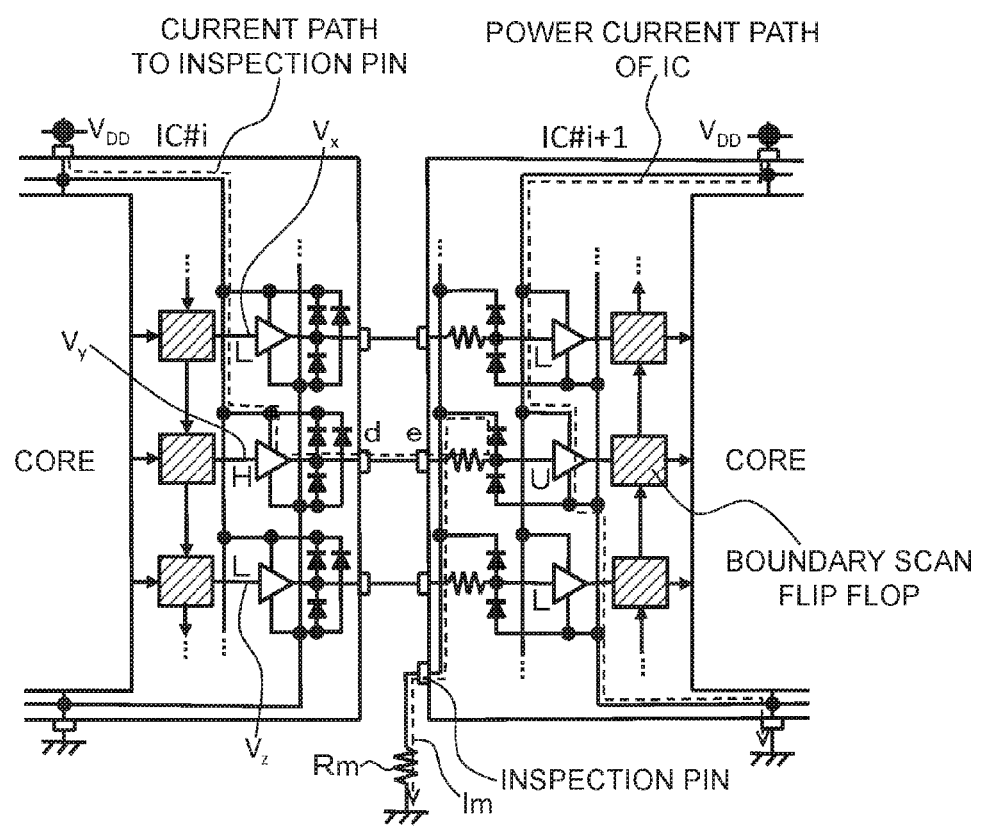
FIG. 2 is a circuit diagram of an example of a related art described in Patent Document 1.

Hereinafter, exemplary embodiments will be described with reference to the appended drawings. However, the present invention is not interpreted to be limited to a description of the following embodiments. It should be understood by those having skill in the art that a specific configuration of the present invention can be changed within the scope not departing from the spirit and gist of the present invention.

In a configuration of the invention to be described below, the same parts or parts having similar functions are denoted by the same reference numerals in different drawings, and a repeated description may be omitted.

In the present disclosure, notation such as "first," "second," and "third" is added to identify constituent elements and not intended to limit a number or an order necessarily. Numbers identifying constituent elements are used for each context, and a number used in one context does not necessarily indicate the same element in another context. A constituent element identified by a certain number is not prevented from doubling a function of a constituent element identified by another number.

[First Embodiment]

Figure 8:
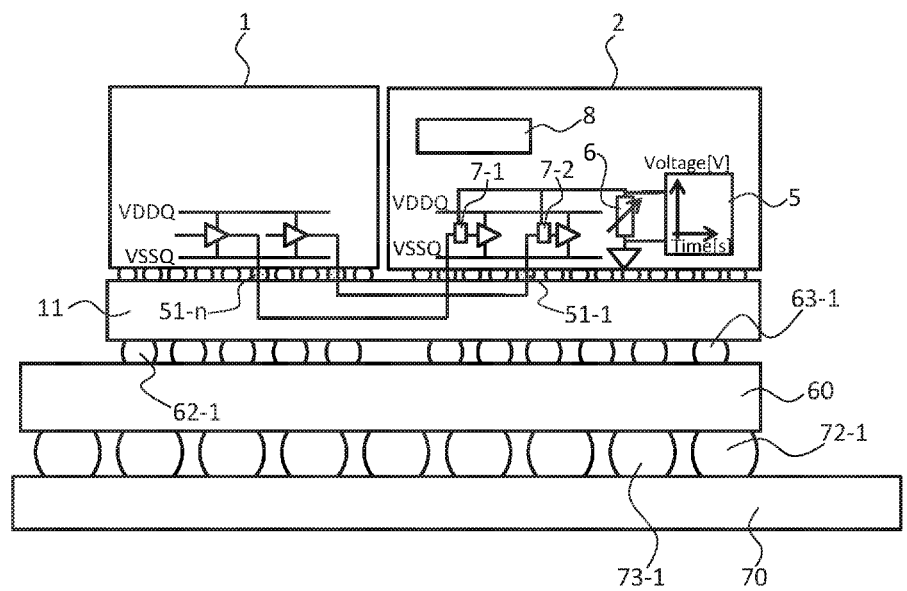
FIG. 8 illustrates a second embodiment and is a configuration diagram when the present invention is applied to a SiP.

FIG. 1 illustrates a basic circuit configuration according to a first embodiment as an embodiment of the present invention. As a specific example of this embodiment, as illustrated in FIG. 8, for example, in a system in package (SiP) including a DRAM DIE 1 mounted on a Si interposer 11 and an ASIC DIE 2 that performs various controls, a circuit that monitors all signal connections via the Si interposer 11 and a connection state between a power voltage VDDQ supplied from the Si interposer 11 and a ground potential VSSQ is provided.

FIG. 1 illustrates a configuration in which a first circuit block 1 and a second circuit block 2 are electrically connected via a wiring block 11 in a broader sense. Power supply to the first circuit block 1 and the second circuit block 2 is performed via the wiring block 11. In this configuration, an example of one-way communication case in which the first circuit block 1 includes output circuits 9-1 and 9-2, and the second circuit block 2 includes input circuits 10-1 and 10-2 is described, but even in the case of two-way communication in which each of the first circuit block and the second circuit block 2 includes an input output circuit, a similar configuration can be applied. In FIG. 1, for the sake of simplicity, two signal systems are representatively described (corresponding to an example in which four bump arrays indicated by 54 are cut in the example of the bump arrangement illustrated in FIG. 3), but a similar configuration can be applied even when there are more signal systems.

Next, features of the present embodiment will be described with reference to FIG. 1. First, path switching circuits 7-1 and 7-2 are arranged at a stage prior to the input circuits 10-1 and 10-2. Each of the path switching circuits 7-1 and 7-2 has a function of switching an input from the left side (the first circuit block 1) to an output path to receiver circuits (input circuits 10-1 and 10-2) or an output path to a resistance switcher 6 according to an input a control circuit 8. The resistance switcher 6 includes a voltage observation circuit 5 that monitors a voltage between both ends of the resistor.

In the first circuit block 1, the remaining circuits excluding the output circuits 9-1 and 9-2 are referred to collectively as an "internal circuit." In the second circuit block 2, an internal circuit connected after the input circuits 10-1 and 10-2 is not illustrated.

A configuration example of path switching circuits 7-1 and 7-2 is illustrated in FIGS. 4A and 4B. An external specification is illustrated in FIG. 4A, and this circuit has a one-input two-output configuration, and a path and a switching timing thereof are controlled according to a control signal or a clock given from the outside. In a configuration of FIG. 4B, a path or whether or not an input or an output is controlled according to a 2-bit control signal using pass transistors 30-1 to 30-3.

Next, a device that determines connection states of a power/ground connection terminal will be described using the circuit configuration of FIG. 1 with reference to FIG. 5. Here, a process in which a breakage state of a power supply pin 42 is observed will be described.

An operation process includes the following four steps.

(1) A resistance of the resistance switcher 6 is switched to a resistance value of 1 kΩ or more (high-Z);

(2) A path is switched using path switching circuits 7-1 and 7-2 as follows. An output destination of the path switching circuit 7-1 is set to the resistance switcher 6, and the path switching circuit 7-2 is connected to the receiver circuit (input circuit 10-2).

(3) Input logics to the output circuits 9-1 and 9-2 are determined. In this example, an input logic (a signal 1) to the output circuit 9-1 is fixed to high, and a step wave that switches from 0 to 1 and then maintains 1 for a while is used as an input logic (a signal 2) to the output circuit 9-2. Here, a signal fixing time of the step wave is an order of μsec.

(4) A state is monitored by measuring a power variation waveform based on a power current variation 20 flowing from the output circuit 9-1 to the resistance switcher 6 via the path switching circuit 7-1 through the voltage observation circuit 5.

A phenomenon observed as the power current variation 20 is that when the input logic (signal 1) to the output circuit 9-1 is fixed to high, a power supply line 14 and a path are short-circuited, and a state of the power supply line is output via a signal pin 41-1. In this state, when a signal of switching the input logic (signal 2) to the output circuit 9-2 from 0 to 1 is applied, in order to draw the power current from the outside at the time of switching, the power current varies due to an impedance relation therearound.

In other words, as a measurement principle, a connection state of a specific power supply pin or a specific ground pin is measured based on a physical quantity such as a power or ground variation by using one (41-1) of signal pins near a power supply pin 42 and a ground pin 43 as a path in which a power current or a ground current flows and using another signal pin 41-2 therearound as a step current source for power variation.

In other words, when the breakage state of the power supply pin 42 is observed, the input to the output circuit 9-1 is fixed to high, and the step wave that switches from low to high is used as the input of the output circuit 9-2. When the breakage state of the ground pin 43 is observed, the input to the output circuit 9-1 is fixed to low, and the step wave that switches from high to low is used as the input of the output circuit 9-2. The resistance of the resistance switcher 6 is set to a setting value of High-Z of kΩ or more in order to observe generated power variation with as large amplitude as possible.

Figure 5:
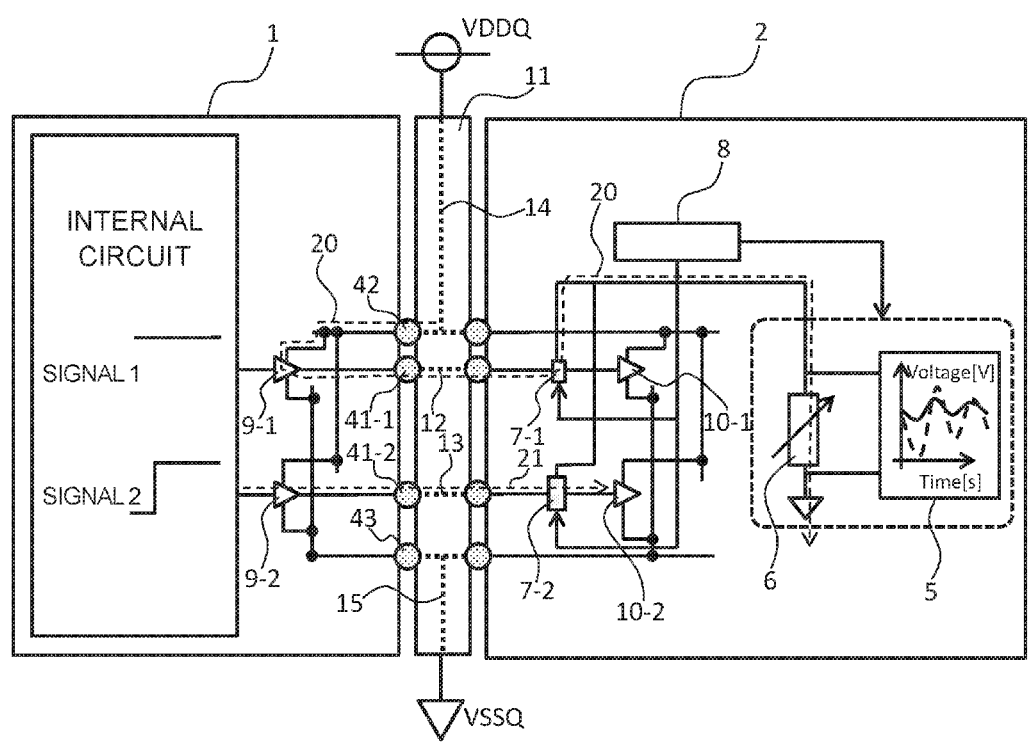
FIG. 5 is an operation explanation diagram when connection states of a power supply pin and a ground pin are monitored in an operation principle of the first embodiment.

In FIG. 5, the step wave is generated only from the output circuit 9-2, but it is desirable that the step waves be input from a plurality of circuits therearound because the power and ground variation amplitudes become larger, and it is easier to observe.

Figure 6:
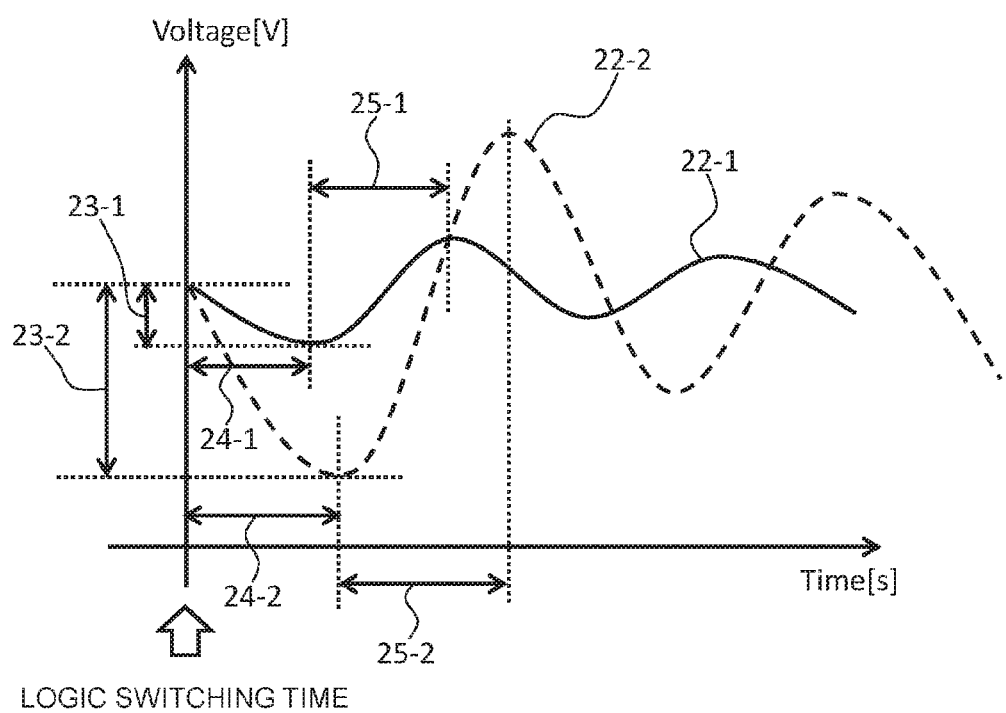
FIG. 6 illustrates an example of a power variation waveform when connection states of a power supply pin and a ground pin are monitored according to the first embodiment.

An example of the power variation waveform obtained consequently is illustrated in FIG. 6. FIG. 6 illustrates a state of power variation is illustrated after the step waves is input at a logic switching time. Generally, when such a step input is performed, a vibration waveform according to a maximum value of a power impedance seen from a target circuit portion and a frequency at which the maximum value exists is generated. Here, two types of voltages wave forms, that is, a voltage waveform 22-1 generated in a normal bump connection state and a voltage waveform 22-2 generated in an abnormal bump connection state such as breakage are illustrated.

Generally, when a bump breakage occurs, an inductance of a power supply system increases, and thus a frequency of an antiresonance impedance of the power supply system decreases, and a maximum impedance value increases. For this reason, a change that a cycle of power variation becomes longer, and an amplitude of power variation becomes larger is shown. By measuring this amount of change, it is possible to monitor the connection state of the bump. As a measured quantity for estimating this change, one of maximum voltages drop differences (23-1 and 23-2), maximum voltage drop time differences (24-1 and 24-2), and vibration period differences (25-1 and 25-2), or a combination of two or more of the differences is used. Therefore, preferably, the voltage observation circuit 5 has a function capable of measuring any one of the differences.

An example of the power variation waveform illustrated in FIG. 6 is an example of the power variation waveform observed when the input to the output circuit 9-1 is fixed to high, and the step wave that switches from low to high is used as the input to the output circuit 9-2 in FIG. 5 in order to observe the state of the power supply pin 42 is observed. On the other hand, the power variation waveform observed when the input to the output circuit 9-1 is fixed to low, and the step wave that switches from high to low is used as the input to the output circuit 9-2 in order to observe the state of the ground pin 43 shows a similar tendency to that of FIG. 6.

A configuration example of the voltage observation circuit 5 will be described using two methods as an example. These are merely one of implementation means and are not intended to limit a method thereof.

Figure 11:
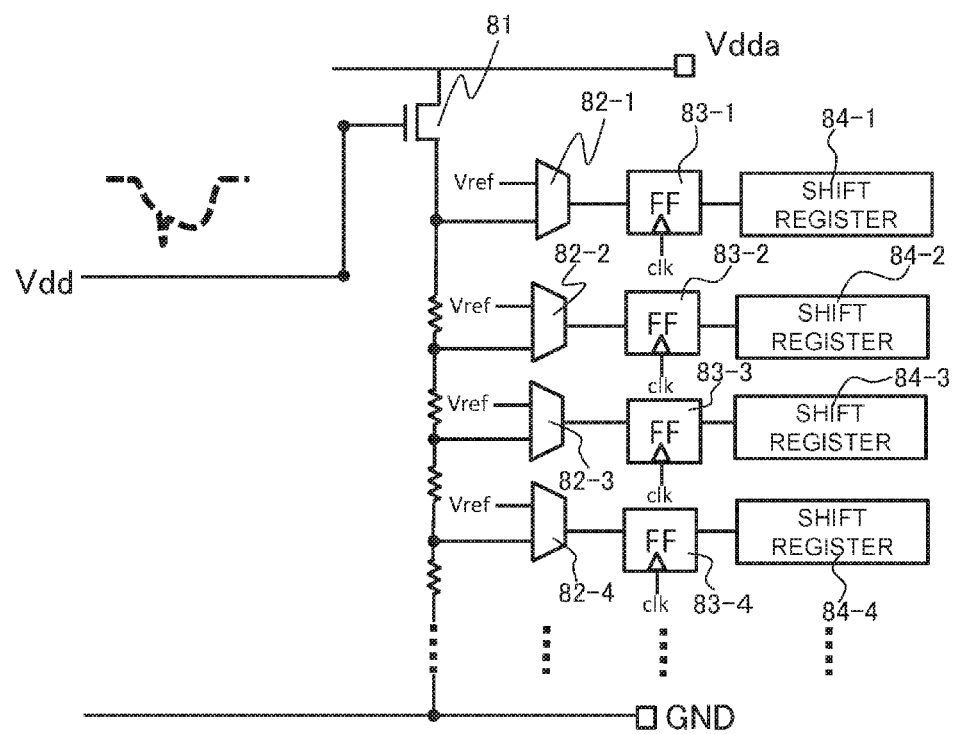
FIG. 11 illustrates one of implementation examples of a voltage observation circuit which is one of basic configurations of the present invention and is a circuit for digitizing voltage waveform information.

First, a first example is a circuit that measures a voltage variation as a waveform and illustrated in FIG. 11. Referring to FIG. 11, the circuit includes a multi-step level shift circuit, comparators 82-1 to 82-4 connected to the multi-step level shift circuit, FF circuits 83-1 to 83-4, and shift registers 84-1 to 84-4. When an electric current flows to the level shift circuit indicated by 81 in FIG. 11, a voltage is decreased by a resistance, a decreased voltage is compared with a predetermined threshold voltage Vref through the comparator circuit, and 0 or 1 is written in the FF in a magnitude relation. This is a circuit that can repeat it at specific time intervals, save digital information thereof in the shift register circuit, and quantify a time and a range of a voltage at that time.

In other words, when a step size of a resistance value of the level shift circuit is decreased to increase the number of steps, it is possible to increase and complement a resolution using information of the power variation waveform observed in the multi-step shift register as a boundary line of a pattern area of 0 and 1.

Since it is possible to acquire the power variation waveform using this circuit, it is possible to observe all of the maximum voltage drop difference, the maximum voltage drop time difference, and the vibration period difference using data measured through this circuit.

Although it is a circuit suitable for detecting detailed information of the voltage waveform, but since it is necessary to increase the number of level shift steps and the number of bits of the shift register in order to obtain a voltage resolution and a temporal resolution sufficiently, and thus it is in a trade-off relation with a circuit size or power consumption.

Figure 12:
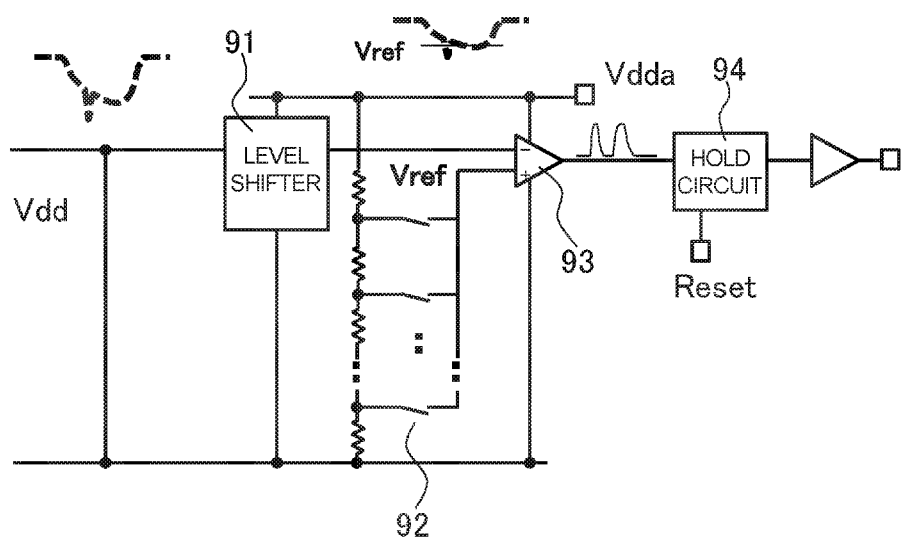
FIG. 12 illustrates one of implementation examples of a voltage observation circuit which is one of basic configurations of the present invention and is a circuit for detecting a voltage decrease amount.

A second configuration example of the voltage observation circuit 5 is a circuit that detects that a voltage decrease amount exceeds a certain value as illustrated in FIG. 12. This circuit includes a level shift circuit 91, a comparator 93, and a hold circuit 94. The comparator 93 has only one step. In this system, it is possible to transmit a signal of logic 1 to the hold circuit 94 only when the voltage decrease amount exceeds a certain value. Since it is possible to change a threshold value Vref of the voltage decrease amount for detection through a switch circuit 92, it is possible to detect a desired voltage decrease amount by changing the threshold value according to a measurement object. It is a method of observing only the difference of the voltage decrease amount, but there is a feature that a circuit size or power consumption can be suppressed.

In addition, a method of observing a change in an oscillation frequency using a ring oscillator and a voltage circuit method of observing a delay amount of an inverter can be also considered, but either method may be used.

Next, a principle of monitoring the connection state of the signal pin through the same circuit configuration as that of FIG. 1 will be described. In this case, a static current is applied to a signal pin of a measurement target (41-1 in this case) for a certain period of time, and a bump breakage state is monitored based on a change in a voltage level generated at that time.

An operation process at this time includes the following four steps.

(1) A resistance of the resistance switcher 6 is switched to a resistance value (a resistance of an appropriate value within a range of 0.1 Ω to 10 Ω. Typically, about several ohms (Ω)) which is substantially equal to a resistance value when a wiring failure occurs (a resistance value when the signal pin 41-1 is broken).

(2) A path is switched using the path switching circuits 7-1 and 7-2 as follows. The path switching circuit 7-1 sets the resistance switcher 6 as the output destination, and the path switching circuit 7-2 is connected to the receiver circuit (input circuit 10-2).

(3) An input logic to the output circuit 9-1 is determined. Here, the input to the output circuit 9-1 performs of transition of low→high→low. At this time, a period of high is fixed to a period of time enough to measure a DC resistance (an order of μs).

(4) A state is monitored by measuring a power variation waveform based on a power current variation flowing from the output circuit 9-1 to the resistance switcher 6 via the path switching circuit 7-1 through the voltage observation circuit 5.

In this case, when a bump breakage or the like occurs, it appears as a potential difference between both ends of the resistance switcher 6, and thus it is possible to monitor the state accordingly.

In all of the power supply pin, the ground pin, and the signal pin, the breakage state of the bump appears as an analog change of an electric characteristic, and thus it is possible to monitor a breaking state in addition to a simple disconnection.

For example, an operation of sequentially monitoring the connection states of all of the power supply pin, the ground pin, and the signal pin between the DRAM DIE 1 mounted on the interposer 11 and the ASIC DIE 2 is performed based on the inspection circuit configuration illustrated in FIG. 1.

Figure 7:
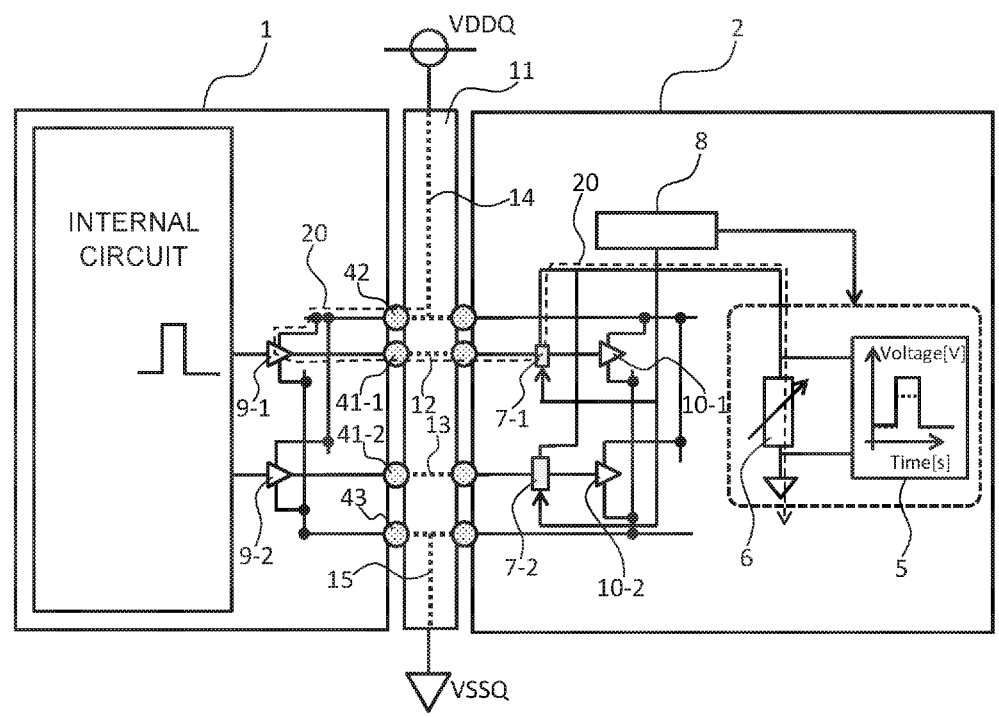
FIG. 7 is an operation explanation diagram when a connection state of a signal pin is monitored in an operation principle of the first embodiment.

In the first circuit block 1 illustrated in FIGS. 5 and 7, the input logic may be input to the output circuits 9-1 and 9-2, for example, such that a boundary scan flip-flop circuit is provided in an internal circuit, and a corresponding input logic may be sequentially output to an output circuit of an inspection target.

Alternatively, when a memory is mounted in the internal circuit of the first circuit block 1, a program of writing data such as data pattern of an input logic in advance and sequentially reading an address so that the data is sequentially output to an output circuit of a signal pin of an inspection target may be installed. Then, the program that reads it is activated at the time of inspection from at the second circuit block 2 side, the control circuit 8 sequentially switches the corresponding path switching circuits 7-1 to 7-n in synchronization with the read input logic, and the power variation waveform measured by the electric current flowing to the resistance switcher 6 via the connection paths of the power supply pin, the ground pin, and the signal pin is measured through the voltage observation circuit 5.

Therefore, in the present embodiment, a device that generates the input logic is not specified.

In the second circuit block 2, for example, the voltage observation circuit 5 that observes the connection states of the power supply pin, the ground pin, and the signal pin using the power variation waveform is configured with a circuit illustrated in FIG. 11. The voltage observation circuit 5 records one power variation waveform measured using the electric current flowing through one connection path (including wirings from the bump on the first circuit block 1 side to the bump at the second circuit block 2 side and an electric conductor portion) in the shift register. The second circuit block 2 includes a logic circuit that reads power variation waveform data from the shift register of the voltage observation circuit 5 and calculates feature quantities of a maximum voltage drop, a maximum voltage drop time, and a vibration period or an inspection program executed by a CPU. The logic circuit is included in the control circuit (8) of FIG. 5 or FIG. 7. Although not illustrated specifically, the inspection program executed by the CPU operates, for example, in the internal circuit of the first circuit block 1 of FIG. 7.

In addition, the semiconductor LSI package of the system in package (SiP) is mounted in the product, the connection states of the power supply pin, the ground pin, and the signal pin are observed the voltage observation circuit 5 at the time of shipment of the product, and when the connection states are normal, the feature quantities of the maximum voltage drop, the maximum voltage drop time, and the vibration period of the of the power variation waveform are calculated and recorded in the memory.

Then, the logic circuit compares the feature quantities of the same connection path recorded in the memory, evaluates the maximum voltage drop difference, the maximum voltage drop time difference, the oscillation period difference, and determines whether the state of each connection path of the evaluation target is normal or abnormal. The logic circuit performs the determination of one connection path, resets the shift register of the voltage observation circuit 5, and repeatedly performs the process of reading the power variation waveform data of a next connection path.

Further, the logic circuit has a function of transmitting information (a failure position, the state, and the like) to the system side when the state is determined to be abnormal. This function is included in the control circuit (8) of FIG. 5 or FIG. 7.

[Second Embodiment]

FIG. 8 illustrates a second embodiment of the present invention and is a cross-sectional view when the present invention is applied to a system in package (SiP).

In this case, a semiconductor circuit block can be considered to be a plurality of LSIs mounted on an interposer. In this configuration, connection paths 12, 13, 14, and 15 between the first circuit block 1 and the second circuit block 2 of FIG. 1 include a microbump connecting each LSI with the interposer and a wiring in the interposer. However, the inspection circuit of the present embodiment is mainly suitable for monitoring the connection state of the microbump portion connecting LSI with interposer.

Although FIG. 8 illustrates an example of one-way transmission using two LSIs, the number of LSIs and the signal transmission direction may be arbitrary and, for example, bidirectional.

[Third Embodiment]

Figure 9:
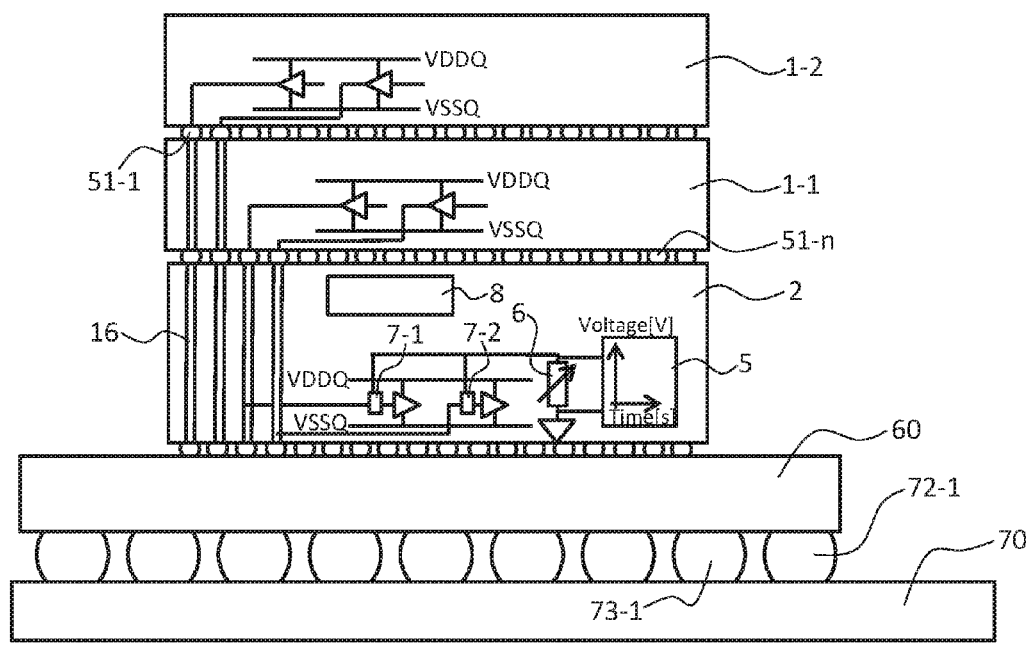
FIG. 9 illustrates a third embodiment and is a configuration diagram when the present invention is applied to a 3D stacked LSI.

FIG. 9 illustrates an example in which the present invention is applied to connection between LSIs configured such a plurality of DRAM DIEs 1-1 and 1-2 (up to about 8 DRAM DIEs) are three-dimensionally stacked on a ASIC DIE 2 as a third embodiment of the present invention. In this embodiment, it is also possible to monitor a connection state of a through silicon vias TSV 16 for connecting the upper and lower LSIs.

[Fourth Embodiment]

Figure 10:
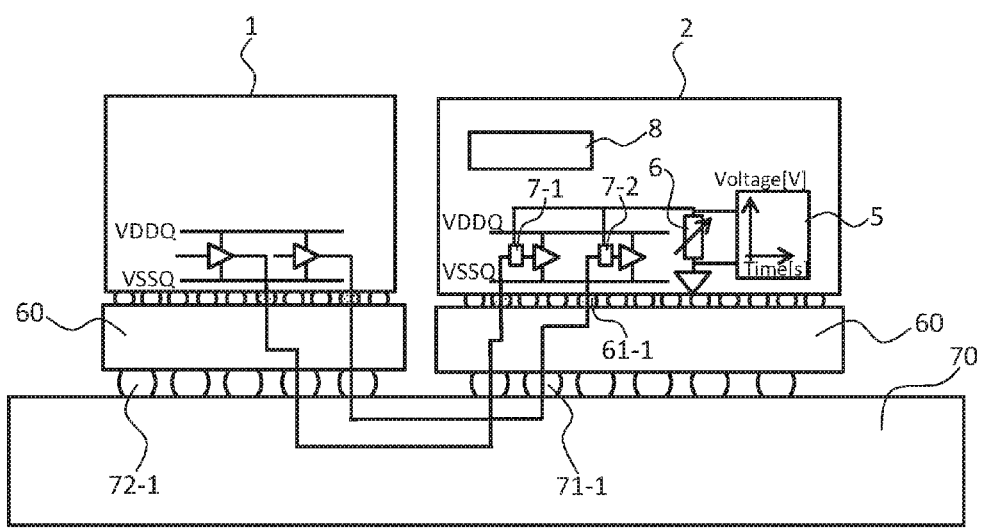
FIG. 10 illustrates a fourth embodiment and is a configuration diagram when the present invention is applied to a common semiconductor package.

FIG. 10 illustrates an example in which the present invention is applied to inspection of a connection state between LSIs when a common LSI package is mounted on a board (printed circuit board) 70 as a fourth embodiment of the present invention. In this embodiment, it is possible to monitor a connection state of a BGA ball 71-1 in addition to a C 4 bump 61-1 connecting LSIs 1 and 2 with a package substrate 60.

[Fifth Embodiment]

An example in which a system in package (SiP) into which a circuit for inspecting a connection state between LSIs is incorporated is applied to a communication device is considered as a fifth embodiment of the present invention. In the inspection using the present inspection circuit, since an inspection time of about one microsecond per bump pin is taken when the number of pins is about 100 to 1000, an interface circuit is occupied for inspection for about several milliseconds.

However, in communication devices, valid data does not constantly flow, and there is an idle period. It is desirable to perform a connection test during this idle period.

[Sixth Embodiment]

As a sixth embodiment of the present invention, since communication devices includes a diagnostic control unit (for example, a diagnostic processor or the like), the diagnostic control unit may perform a process of reading the power variation waveform data from the logic circuit or the shift register of the voltage observation circuit 5 executed by the inspection program, evaluating the maximum voltage drop difference, the maximum voltage drop time difference, the oscillation period difference, and determining whether the state of each connection path of the evaluation target is normal or abnormal.

Figure 3:
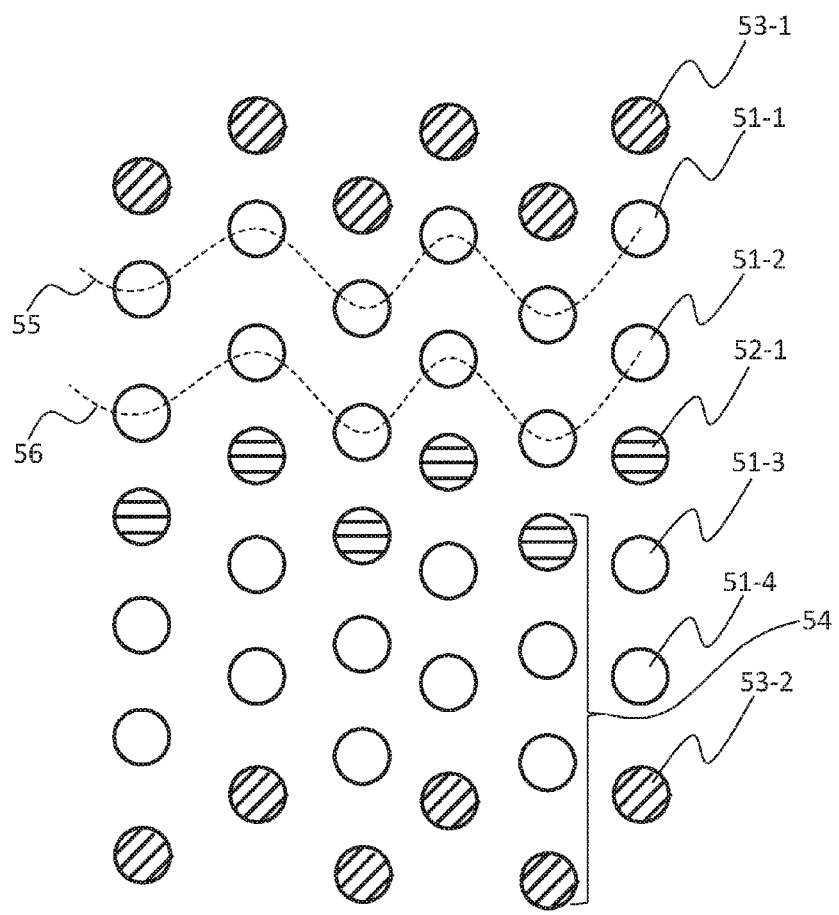
FIG. 3 illustrates an example of a bump arrangement of a semiconductor LSI of an inspection target.

Since the determination is performed on each connection path, it can be used for continuously providing a service of early detecting a channel including a signal pin in which an abnormality occurs, early separating a channel which is broken or likely to be broken, and switching to an alternative channel, for example, for channels 55 and 56 which are a set of signal pins corresponding to a group of data read units in the bump arrangement illustrated in FIG. 3.

[Seventh Embodiment]

An example in which the present invention is applied to a plant control device is described as a seventh embodiment of the present invention. Commonly, control devices used in plants or the like have a diagnostic cycle in addition to a normal control cycle. A connection inspection can be carried out using this diagnosis cycle.

[Eighth Embodiment]

An example in which the present invention is applied to an in-vehicle semiconductor component is described as an eighth embodiment of the present invention. It is difficult to test an automobile while traveling, but it is possible to perform inspection for a few minutes when it stops or after an engine stops. Furthermore, it is possible to perform inspection immediately after an engine is started and alarm the user to inform of whether or not there is an abnormality.

REFERENCE SIGNS LIST

1 first circuit block
1-1 to 1-2 DRAM DIE
2 second circuit block, ASIC DIE
5 voltage observation circuit
6 resistance switcher
7-1 to 7-2 path switching circuit
8 control circuit
9-1 to 9-2 output circuit (driver circuit)
10-1 to 10-2 input circuit (receiver circuit)
11 wiring block, interposer
12 first signal wiring
13 second signal wiring
14 power supply wiring
15 ground wiring
20, 21 current path
22-1 to 22-2 voltage waveform
23-1 to 23-2 voltage decrease amount
24-1 to 24-2 maximum voltage drop time
25-1 to 25-2 voltage variation period 30-1 to 30-3 pass transistor
41-1 to 41-2 signal terminal
42 power supply terminal
43 ground terminal
51-1 to 51-4 signal microbump
52-1 to 52-2 power supply microbump
53-1 to 53-2 ground microbump
60 LSI package substrate
61-1 to 61-2 signal C4 bump
62-1 to 62-2 power supply C4 bump
63-1 to 63-2 ground C4 bump
70 printed circuit board
71-1 to 71-2 signal BGA ball
72-1 to 72-2 power supply BGA ball
73-1 to 73-2 ground BGA ball
81 level shift circuit
82-1 to 4 comparator
83-1 to 4 FF circuit
84-1 to 4 shift register circuit
91 level shift circuit
92 switch circuit
93 comparator
94 hold circuit

The invention claimed is:

1. A semiconductor device, comprising:
a first circuit block including first and second output circuits;
a second circuit block including first and second input circuits; and
a wiring block that connects an output pin from the first output circuit and an input pin to the first input circuit via a wiring and connects an output pin from the second output circuit and an input pin to the second input circuit via a wiring,
wherein power supply pins of the first and second circuit blocks configured to supply electric power to the output circuits and the input circuits and a ground pin are connected with a wiring for power supply to the wiring block and a wiring for a ground, and
the second circuit block includes a path switching circuit provided at a stage prior to the input circuits, a resistance switcher provided ahead of a path bifurcated by the path switching circuit, and a voltage observation circuit for observing a voltage between both ends of a resistor of the resistance switcher.

2. The semiconductor device according to claim 1,
wherein connection states of the power supply pins are inspected by applying a logic input fixed to high to the first output circuit, applying a logic input of a step wave that switches from low to high to the second output circuit, and observing a power variation waveform bifurcated by the path switching circuit at the stage prior to the first input circuit through the voltage observation circuit.

3. The semiconductor device according to claim 1,
wherein a connection state of the ground pin is inspected by applying a logic input fixed to low to the first output circuit, applying a logic input of a step wave that switches from high to low to the second output circuit, and observing a power variation waveform bifurcated by the path switching circuit at the stage prior to the first input circuit through the voltage observation circuit.

4. The semiconductor device according to claim 1,
wherein a connection state of a wiring path that connects the output pin from the first output circuit with the input pin to the first input circuit is inspected by applying a logic input which performs transition of low→high-→low and has a period of high fixed to a period of time enough to measure a DC resistance (an order of µs) to the first input circuit and by observing a power variation waveform bifurcated by the path switching circuit at the stage prior to the first input circuit through the voltage observation circuit.

5. The semiconductor device according to claim 1,
wherein the path switching circuit has a one-input two-output configuration that includes three pass transistors and operates according to a 2-bit control signal.

6. The semiconductor device according to claim 1,
wherein the voltage observation circuit includes a multi-step level shift circuit, a multi-step comparator connected to the multi-step level shift circuit, a multi-step FF circuit, and a multi-step shift register.

7. The semiconductor device according to claim 1,
wherein the voltage observation circuit includes a level shift circuit, a comparator, and a hold circuit.

8. The semiconductor device according to claim 2,
wherein the resistance switcher includes a resistor of a range of 0.1 Ω to 10 Ω and a resistor of 1 kΩ or more, and
a resistance of the resistance switcher is switched to a resistance of 1 kΩ or more.

9. The semiconductor device according to claim 4,
wherein the resistance switcher includes a resistor of a range of 0.1 Ω to 10 Ω and a resistor of 1 kΩ or more, and
a resistance of the resistance switcher is switched to a resistance having an appropriate value within a range of 0.1 Ω to 10 Ω.

10. A multi-chip module, comprising:
a first semiconductor LSI including first and second output circuits;
a second semiconductor LSI including first and second input circuits; and
a wiring substrate in which an output pin from the first output circuit is connected with an input pin to the first input circuit via a wiring, and an output pin from the second output circuit is connected with an input pin to the second input circuit via a wiring,
wherein power supply pins of the first and second semiconductor LSIs configured to supply electric power to the output circuits and the input circuits and a ground pin are connected with a wiring for power supply to the wiring substrate and a wiring for a ground, and
the second semiconductor LSI includes a path switching circuit provided at a stage prior to the input circuits, a resistance switcher provided ahead of a path bifurcated by the path switching circuit, and a voltage observation circuit for observing a voltage between both ends of a resistor of the resistance switcher.

11. The multi-chip module according to claim 10,
wherein connection states of the power supply pins are inspected by applying a logic input fixed to high to the first output circuit, applying a logic input of a step wave that switches from low to high to the second output circuit, and observing a power variation waveform bifurcated by the path switching circuit at the stage prior to the first input circuit through the voltage observation circuit.

12. The multi-chip module according to claim 10,
wherein a connection state of the ground pin is inspected by applying a logic input fixed to low to the first output circuit, applying a logic input of a step wave that switches from high to low to the second output circuit, and observing a power variation waveform bifurcated by the path switching circuit at the stage prior to the first input circuit through the voltage observation circuit.

13. The multi-chip module according to claim 10, wherein a connection state of a wiring path that connects the output pin from the first output circuit with the input pin to the first input circuit is inspected by applying a logic input which performs transition of low→high-→low and has a period of high fixed to a period of time enough to measure a DC resistance (an order of µs) to the first input circuit and by observing a power variation waveform bifurcated by the path switching circuit at the stage prior to the first input circuit through the voltage observation circuit.

14. The multi-chip module according to claim 10, wherein the second semiconductor LSI is mounted on the wiring substrate, the first semiconductor LSI is mounted on the second semiconductor LSI, the connection between the output pin from the first output circuit and the input pin to the first input circuit and the connection between the output pin from the second output circuit and the input pin to the second input circuit are performed by through silicon vias TSV formed in the second semiconductor LSI instead of the wiring of the wiring substrate, and the through silicon vias TSV formed in the second semiconductor LSI is used for the connection between the power supply pin of the first semiconductor LSI and the ground pin and the wiring of the wiring substrate.

15. A semiconductor system, comprising:

the semiconductor device according to claim 1, wherein a voltage amount of a normal connection state at a time of device shipment is stored in a memory, and an abnormal state is determined based on comparison of the voltage amount recorded in the memory and with an actual value at that time.

16. A semiconductor system, comprising:

the semiconductor device according to claim 1, and a mechanism that gives an alarm indicating an abnormal position or a state to a system when an abnormality is detected by an inspection circuit.

17. A semiconductor system, comprising:

the semiconductor device according to claim 1, wherein when an abnormality is detected by an inspection circuit, a portion having a failure is separated or replaced with a redundant system.

18. A semiconductor system, comprising:

the multi-chip module according to claim 10, wherein an inspection program is executed using operation idle times of the first semiconductor LSI and the second semiconductor LSI.

19. A semiconductor system, comprising:

the semiconductor device according to claim 1, wherein a diagnostic control mode in which an inspection program is executed is repeated at regular intervals.

* * * * *